United States Patent
Tamai et al.

(10) Patent No.: US 7,045,840 B2
(45) Date of Patent: May 16, 2006

(54) NONVOLATILE SEMICONDUCTOR MEMORY DEVICE COMPRISING A VARIABLE RESISTIVE ELEMENT CONTAINING A PEROVSKITE-TYPE CRYSTAL STRUCTURE

(75) Inventors: Yukio Tamai, Fukuyama (JP); Nobuyoshi Awaya, Tenri (JP); Shinji Kobayashi, Nara (JP); Hidechika Kawazoe, Kitakatsuragi-gun (JP); Toshimasa Suzuki, Takasaki (JP); Hidetoshi Masuda, Takasaki (JP); Naoto Hagiwara, Gumma-gun (JP); Yuji Matsushita, Takasaki (JP); Yuji Nishi, Gumma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/001,744

(22) Filed: Dec. 1, 2004

(65) Prior Publication Data

US 2005/0145910 A1 Jul. 7, 2005

(30) Foreign Application Priority Data

Dec. 4, 2003 (JP) .............................. 2003-405718

(51) Int. Cl.
*H01L 29/76* (2006.01)
(52) U.S. Cl. ........................ 257/295; 257/213; 257/288

(58) Field of Classification Search ................ 257/179, 257/249, 295, 310, 309, 312
See application file for complete search history.

(56) References Cited

U.S. PATENT DOCUMENTS

| 5,610,103 A | * | 3/1997 | Xu et al. |
| 6,204,139 B1 | | 3/2001 | Liu et al. |
| 6,762,481 B1 | * | 7/2004 | Liu et al. |

OTHER PUBLICATIONS

Liu, S.Q. et al. (2000). "Electric-Pulse-Induced Reversible Resistance Change Effect in Magnetoresistive Films," *Applied Physics Letters* 76(19):2749-2751.

* cited by examiner

*Primary Examiner*—Nathan J. Flynn
*Assistant Examiner*—Kevin Quinto
(74) *Attorney, Agent, or Firm*—Morrison & Foerster LLP (57) ABSTRACT

In a nonvolatile semiconductor memory device including a variable resistive element formed by sequentially stacking a lower electrode, a variable resistor with a perovskite-type crystal structure, and an upper electrode, at least one of the lower electrode and the upper electrode is a particulate electrode configured to include a particulate conductor aggregate so that the contact area with the variable resistor at an interface is effectively reduced to realize high initial resistance of the variable resistive element. Further, a film of the variable resistor is preferably formed so as to be in a highly crystalline state.

8 Claims, 12 Drawing Sheets

PRIOR ART

FIG. 12

NONVOLATILE SEMICONDUCTOR MEMORY DEVICE COMPRISING A VARIABLE RESISTIVE ELEMENT CONTAINING A PEROVSKITE-TYPE CRYSTAL STRUCTURE

CROSS REFERENCE TO RELATED APPLICATION

This Nonprovisional application claims priority under 35 U.S.C. §119(a) on Patent Application No. 2003-405718 filed in Japan on Dec. 4, 2003, the entire contents of which are hereby incorporated by reference.

BACKGROUND OF THE INVENTION

1. Field of the Invention

The present invention relates to a nonvolatile semiconductor memory device. More specifically, the present invention relates to a nonvolatile semiconductor memory device including a variable resistive element formed by sequentially stacking a lower electrode, a variable resistor with a perovskite-type crystal structure, and an upper electrode.

2. Description of the Related Art

As next generation nonvolatile random access memories (NVRAM) capable of operating at high speed, that replace flash memories, there have recently been proposed memories with a variety of device structures, such as FeRAM (Ferroelectric RAM), MRAM (Magnetic RAM) and OUM (Ovonic Unified Memory). The developments of those memories have been intensely competitive in terms of enhanced performance, greater reliability, lower cost and more excellent process matching. However, each of those memories has its merits and demerits. Hence there is a long way to go before a "universal memory", an ideal memory having all the merits of the above-mentioned memories, can be realized.

For example, the FeRAM, which has been already in practical use, is produced utilizing a phenomenon of spontaneous polarization inversion of a ferroelectric oxide. The FeRAM is superior in low electric power consumption and high-speed operation, but inferior in high cost and destructive reading. The MRAM uses a ferromagnetic tunnel effect element utilizing a giant magnetoresistance (GMR). The ferromagnetic tunnel effect element has a structure in that two ferromagnetic material layers made of Fe, Co, Ni or the like are sandwiched between extremely thin insulating layers (tunnel barrier layers) made of $Al_2O_3$ or the like, and controls magnitude of a tunnel current that flows through the insulating layer by changing the direction of magnetization (spinning) of the ferromagnetic material layers, to express effects of the memory. However, the ferromagnetic tunnel effect element has a major problem of high electric power consumption in inversion of magnetization at the time of programming, as well as micronization. Further, the OUM, which is produced on the basis of thermal phase transformation of a chalcogenide material, is superior in low cost and process matching, but inferior in micronization and high-speed operation since it thermally operates.

Figure 12:
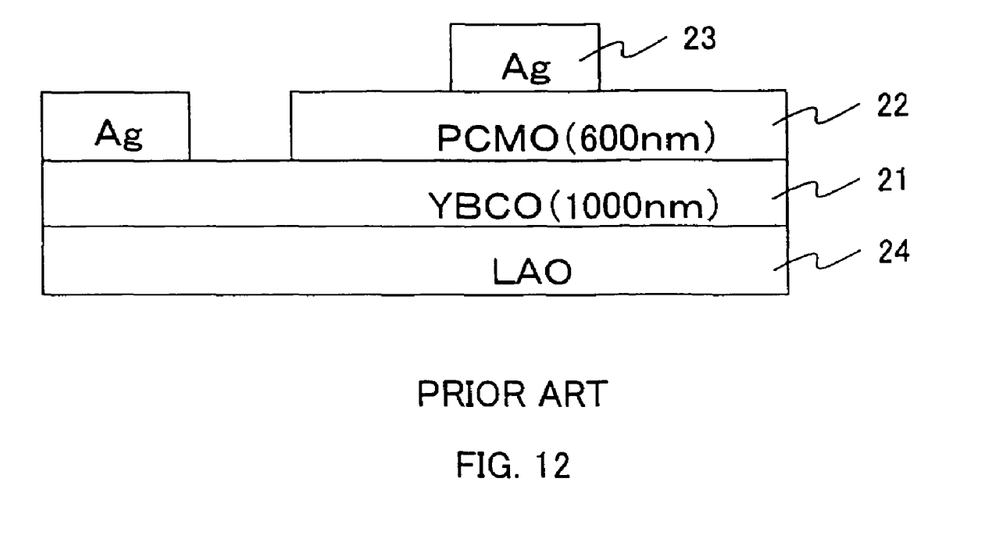
FIG. 12 is a cross-sectional view schematically showing one structure example of a conventional variable resistive element.

As opposed to the above conventional art, there is a method of applying a voltage pulse to a perovskite material, which is known to have a colossal magnetoresistance effect, to reversibly change electric resistance. This method is disclosed in U.S. Pat. No. 6,204,139 and "Electric-pulse-induced reversible resistance change effect in magnetoresistive films", Liu, S. Q. et al., Applied Physics Letter, Vol. 76, pp. 2749–2751, 2000, written by Shangquing Liu, Alex Ignatiev and others, University of Houston, USA. This method is considerably revolutionary in that a resistance change by several digit figures is expressed at room temperature without application of a magnetic field while using the perovskite material known to have the colossal magnetoresistance effect. An RRAM (Resistance Random Access Memory) uses a variable resistive element utilizing this phenomenon. Unlike the MRAM, the RRAM requires no magnetic field and, thus, has extremely low electric power consumption, facilitating micronization as well as high integration, and the dynamic range of the resistance change of the RRAM is markedly wider than that of the MRAM, thereby to obtain multi-level storability. A basic structure of an actual device is extremely simple. As illustrated in FIG. 12, the device is configured by sequentially stacking, in a direction vertical to a substrate, a lower electrode material 21, a perovskite material 22 and an upper electrode material 23. In the element structure illustrated in FIG. 1, the lower electrode material 21 is formed of a film of yttrium-barium-copper oxide, $YBa_2Cu_3O_7$ (YBCO), deposited on a single crystal substrate 24 of lanthanum-aluminum oxide, $LaAlO_3$ (LAO), the perovskite material 22 is formed of a film of crystalline praseodymium-calcium-manganese oxide, $Pr_{1-x}Ca_xMnO_3$ (PCMO), and the upper electrode material 23 is formed of a film of Ag deposited by sputtering. This storage element operates to change the resistance of the perovskite thin film which is sandwiched between the upper and lower electrodes 21 and 23 by controlling a polarity, a voltage and a pulse width of an electric pulse to be applied to between the two electrodes. A resistance value changed by the pulse application is stored for a long period of time after the application, and a nonvolatile memory function can be obtained by, for example, setting the low resistance state to "0" and the high resistance state to "1".

However, in trying to change the resistance of the perovskite thin film in the element structure as illustrated in FIG. 12, the operation voltage is as high as over ten volts to dozens of volts if referring to U.S. Pat. No. 6,204,139. Such a high operation voltage is practically problematic. Lowering the operation voltage has been considered possible by reducing the thickness of the perovskite material film that constitutes the variable resistive element. However, the present inventors have clarified the fact that reduction in thickness of the perovskite thin film in the same element area and the same electrode area causes a very low impedance, a resistance value of 10Ω or less, of the variable resistive element, leading to insufficient capacity to supply current in a commonly usable pulse power source or pulse application circuit. Thereby application of sufficient voltage to the variable resistive element becomes difficult.

SUMMARY OF THE INVENTION

The present invention was made in consideration of the above problems and the object of the present invention is to provide a nonvolatile semiconductor memory device that includes a variable resistive element having a variable resistor with a perovskite-type crystal structure capable of programming information irrespective of large current drive.

In order to achieve the above object, a nonvolatile semiconductor memory device according to the present invention includes a variable resistive element formed by sequentially stacking a lower electrode, a variable resistor with a perovskite-type crystal structure, and an upper electrode. Herein, at least one of the lower electrode and the upper electrode is a particulate electrode configured to include a particulate conductor aggregate.

According to the nonvolatile semiconductor memory device of the present invention, the particulate electrode does not have a uniform flat surface, but has a minutely irregular surface depending on each particle diameter of the particulate conductors. Therefore, on the interface with the variable resistor, the whole surface of the particulate electrode is not electrically in contact but many points on the surface of the particulate electrode are in contact, enabling a great reduction in substantially effective contact area while the contact area remains unchanged. Further, the knowledge newly discovered by the present inventors confirms that the resistance of the variable resistor with the perovskite-type crystal structure increases when the contact area with the electrode becomes smaller even if the cross-sectional area thereof remains unchanged. Namely, in the variable resistor, a current that flows through the contact portion along the voltage-applying direction is considered as exclusively contributing to the resistance, whereas a current that flows in the lateral direction (direction vertical to voltage-applying direction) is considered as hardly contributing to the resistance. Therefore, by making at least one of the lower electrode and the upper electrode a particulate electrode, it is possible to increase the resistance of the variable resistor in a low resistance state to a value so high as to be driven by a normally usable pulse power source or pulse application circuit. This also permits free control of the resistance value while the contact cross-sectional area remains unchanged, by suitable selection of particle diameters (or mean particle diameter) of the particulate conductors constituting the particulate electrode. Consequently, it is possible to obtain a variable resistive element with a suitable resistance value irrespective of the variable resistor area or the electrode area, so as to provide a nonvolatile semiconductor memory device capable of programming information irrespective of large current drive.

It is also preferable that in the nonvolatile semiconductor memory device according to the present invention, the particulate electrode is formed by dispersing the particulate conductors in an insulator.

It is further preferable that in the nonvolatile semiconductor memory device according to the present invention, a film of the variable resistor is formed at a film-forming temperature of 500° C. or more. The film of the variable resistor is formed in a highly crystallized state. Further, the variable resistor in a low resistance state has a volume resistivity of 100 Ωcm or less.

DETAILED DESCRIPTION OF THE PREFERRED EMBODIMENTS

One embodiment of the nonvolatile semiconductor memory device according to the present invention (hereinafter, appropriately referred to as "the inventive device") will be described on the basis of drawings.

Figure 1:
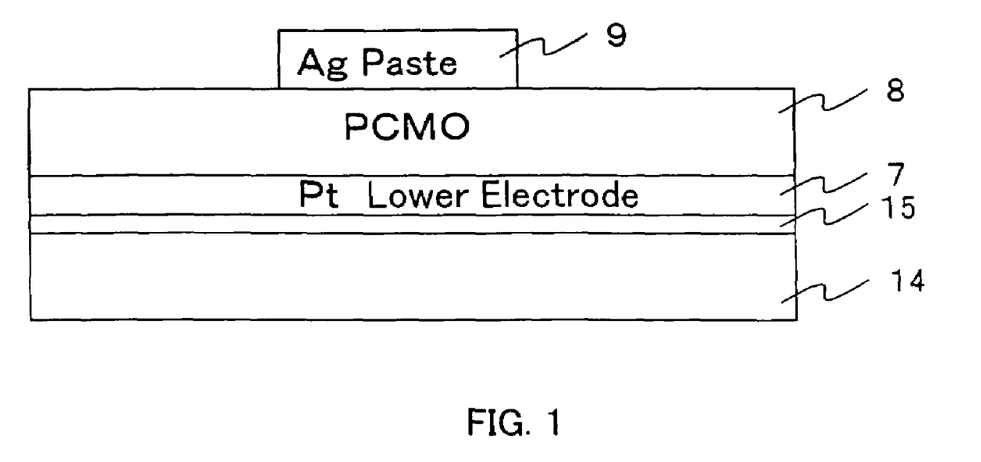
FIG. 1 is a cross-sectional view schematically showing a basic structure of a variable resistive element for use in a nonvolatile semiconductor memory device according to the present invention.

FIG. 1 is a cross-sectional view illustrating a basic structure of a variable resistive element 10 as a nonvolatile memory element for use in the inventive device 100. The variable resistive element 10 basically has a stack structure formed by sequentially stacking a lower electrode 7, a variable resistor 8 with a perovskite-type crystal structure, and an upper electrode 9. The variable resistive element 10 is further characterized in that the upper electrode 9 is a particulate electrode configured of a particulate conductor aggregate. In the following, the variable resistive element 10 will be described in detail.

The variable resistive element 10 having the basic structure illustrated in FIG. 1 is formed as follows. First, a $TiO_2$ layer 15 as a barrier contact layer is formed on a silicon substrate 14 by reactive sputtering. On the surface of the silicon substrate 14, a $SiO_2$ thermally-oxidized film having a thickness of 100 nm has been previously formed. A Pt lower electrode layer having a thickness of 250 nm is deposited, by sputtering with 100% Ar, on the substrates 14 and 15 heated to 400° C. to form the lower electrode 7. On the lower electrode 7, $Pr_{0.7}Ca_{0.3}MnO_3$ (PCMO) is locally epitaxially grown by sputtering under an $O_2$ atmosphere of 20 mTorr and a substrate temperature of 600° C. to a film thickness of about 100 nm, thereby forming the variable resistor 8. A film of the variable resistor 8 is formed and the upper electrode 9 is then formed on the film of the variable resistor 8. The upper electrode 9 is formed as a particulate electrode configured of a particulate conductor aggregate. More specifically, for example, the upper electrode 9 is formed using a silver paste obtained by dispersing silver particles having a mean particle diameter of about 5 µm (one example of the particulate conductors) in a resin. As the silver paste, DM6030Hk (content of silver filler: 92 to 93%), produced by Diemat, Inc. (USA), or the like can be employed.

Figure 2:
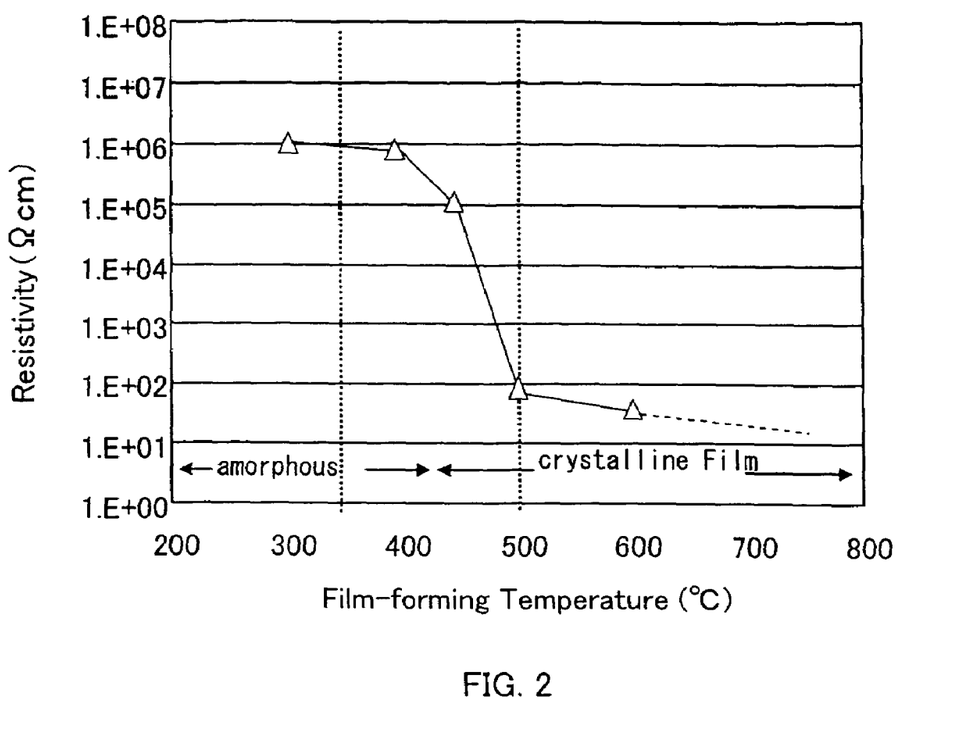
FIG. 2 is a characteristic diagram showing the relationship between the sputtering film-forming temperature and the resistivity of a PCMO film when the PCMO film is formed as one example of a variable resistor with a perovskite-type crystal structure.

Next, the relationship between the film-forming condition and the resistance value of the variable resistor 8 will be described. FIG. 2 shows the relationship between the sputtering film-forming temperature and the resistivity of the PCMO film (resistivity when the PCMO film is in an initial state before voltage application). As illustrated in FIG. 2, when the PCMO film is formed at 500° C. or more, the film is highly crystallized to decrease the dependency of the resistivity on the temperature. This indicates that the film formation in this region makes it easy to obtain a PCMO film with a stable resistivity (100 Ωcm or less). FIG. 2 also shows that the resistivity drastically changes at the film-forming temperature in the range of 400 to 500° C. When the film-forming temperature is 400° C. or less, the PCMO film becomes amorphous to increase the resistivity, but in a subsequent thermal treatment process at 400° C. or more, the resistivity may decrease. Accordingly, it is possible to obtain a stable resistivity uninfluenced by the subsequent thermal treatment process by setting the film-forming temperature for the PCMO film to 600° C. Further, in the case of trying to produce the variable resistive element 10 by actively using conventional semiconductor production processes, the use of the PCMO film in a highly crystalline state brings about the advantage of having the resistance to chemicals to be used in subsequent processes such as photoresist coating, removal, ashing and wafer cleaning.

Since the use of the PCMO film in a highly crystalline state decreases the volume resistivity of the variable resistor 8 itself, when the variable resistive element 10 is formed using such a variable resistor in a highly crystalline state, the resistance value of the variable resistive element 10 in an initial state may be as low as about 10Ω. When the initial resistance value of the variable resistive element 10 is too low, a large current flows upon application of a voltage to change the resistance of the variable resistive element 10, causing excessively large electric power consumption in programming, or inability to change the resistance due to failure to apply an appropriate voltage.

In this embodiment, therefore, the above-mentioned silver paste is used for the upper electrode 9 to form a particulate electrode, thereby markedly reducing the contact area with the variable resistor 8 on the interface so as to promote high resistance of the variable resistive element 10 as a whole in an initial state. In the following, the contact-area reducing effect by means of the particulate electrode will be described.

Figure 3:
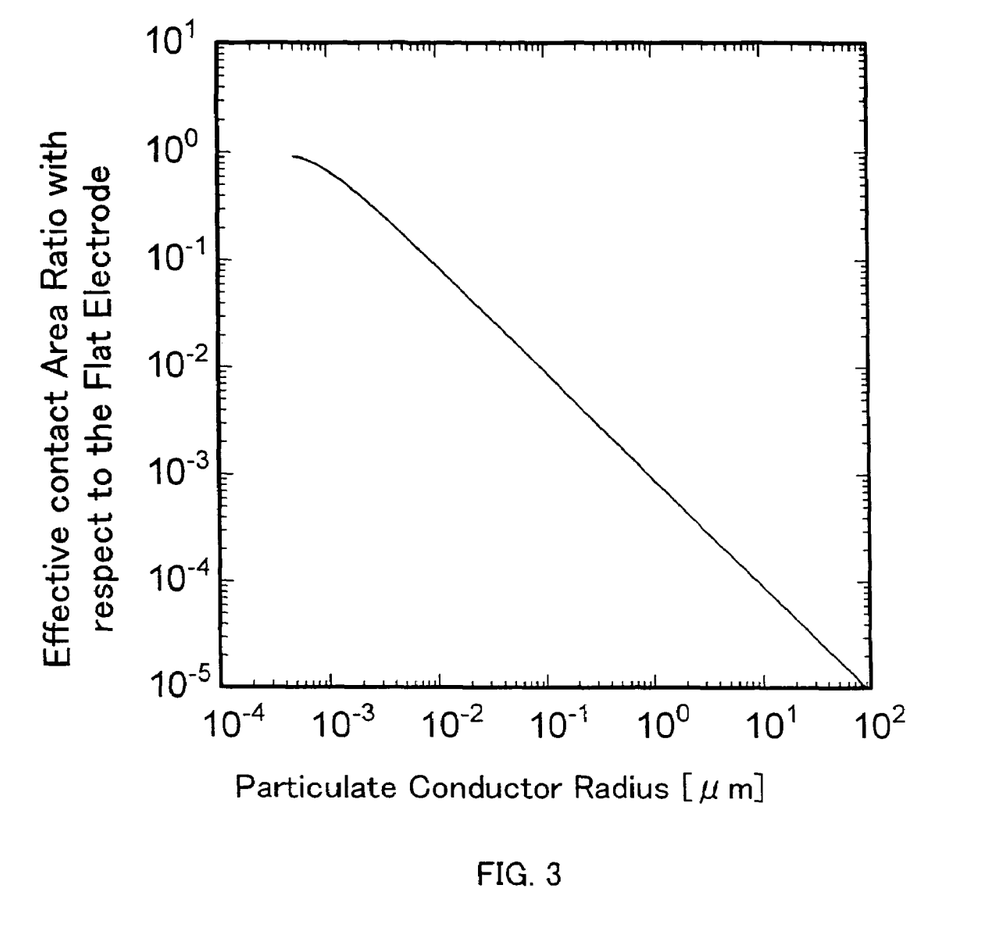
FIG. 3 is a graph showing the relationship between the radius and the effective contact area of the particulate conductors in the particulate electrode.

FIG. 3 shows the result of estimating a ratio of an effective contact area when the particulate conductors are assumed to be circular and tightly filled, to an effective contact area of a flat electrode electrically in contact with the whole interface with the variable resistor 8, with respect to a particle diameter. As shown in FIG. 3, the effective contact area ratio is dependent on the particulate diameter. The larger the particle diameter is, the smaller the ratio becomes. For example, in the case of the particulate conductors having a particle diameter of 5 µm (radius: 2.5 µm), the effective contact area with respect to that of the flat electrode is estimated to decrease to about 1/3000. In this estimation calculation, the interface and the particulate conductors are regarded as being in contact with each other when the clearance therebetween is a prescribed value or less. If this clearance is reduced, the effective contact area becomes further smaller.

Figure 4:
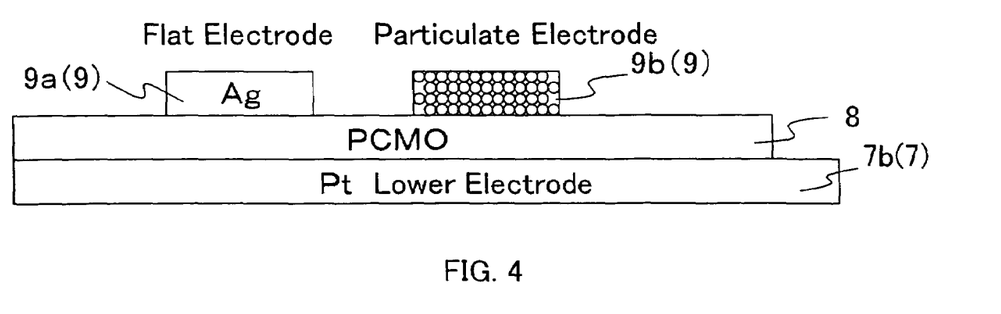
FIG. 4 is a cross-sectional view schematically showing an element structure for comparative experiment of initial resistance values of the variable resistive element with two different upper electrodes.
Figure 5:
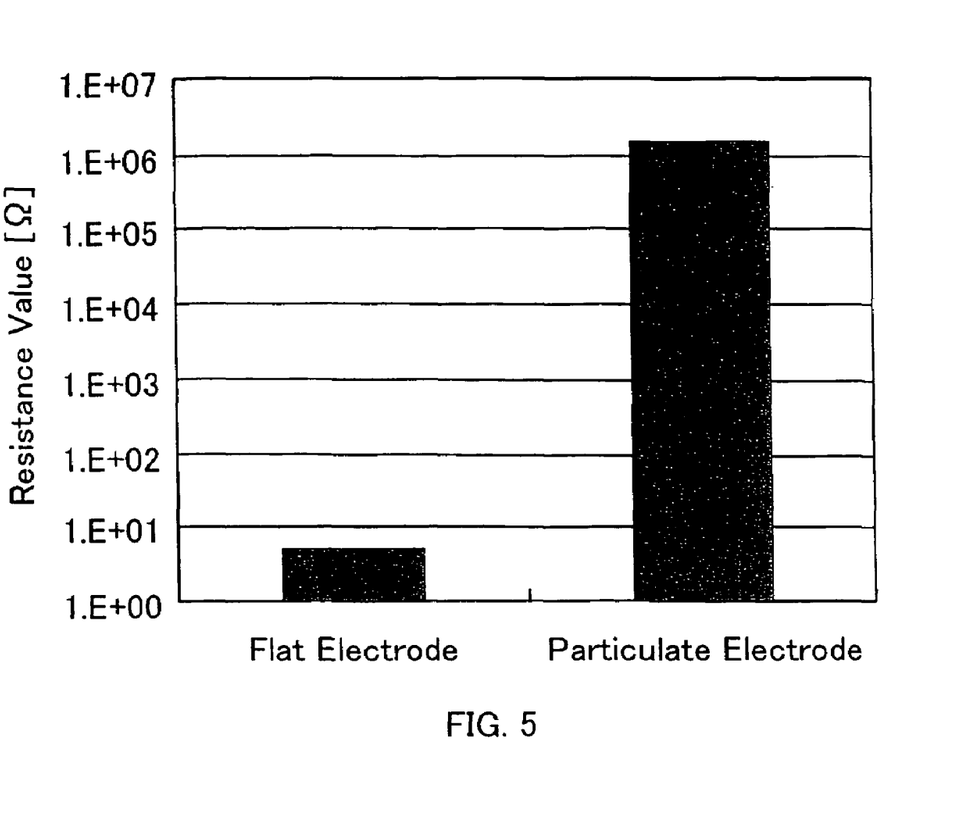
FIG. 5 is a graph showing the comparison between the initial resistance values of the variable resistive element in the case of a flat upper electrode and in the case of a particulate upper electrode.

Using the electrode structure shown in FIG. 4, a comparison experiment was conducted in which an initial resistance value of a variable resistive element in the case of using the flat electrode as the upper electrode is compared with an initial resistance value of the variable resistive element in the case of using a particulate electrode employing a silver paste which is made of silver particles (particulate conductors) with a mean particle diameter of 5 µm. The electrode structure used in this experiment was formed in the same manner as the variable resistive element 10 shown in FIG. 1. Namely, a Pt lower electrode layer 7b was formed as the lower electrode 7, and the PCMO film 8 was formed thereon. Two kinds of upper electrodes 9a and 9b were formed on the PCMO film 8. The one upper electrode is a silver flat electrode 9a, and the other is a particulate electrode 9b using the silver paste. Both electrodes 9a and 9b have the same cross-sectional area parallel to the interface. Using the same lower electrode 7 and the PCMO film 8, the respective initial resistance values of the variable resistive element each of electrodes 9a and 9b were measured, and the measured values are shown in FIG. 5.

Figure 6:
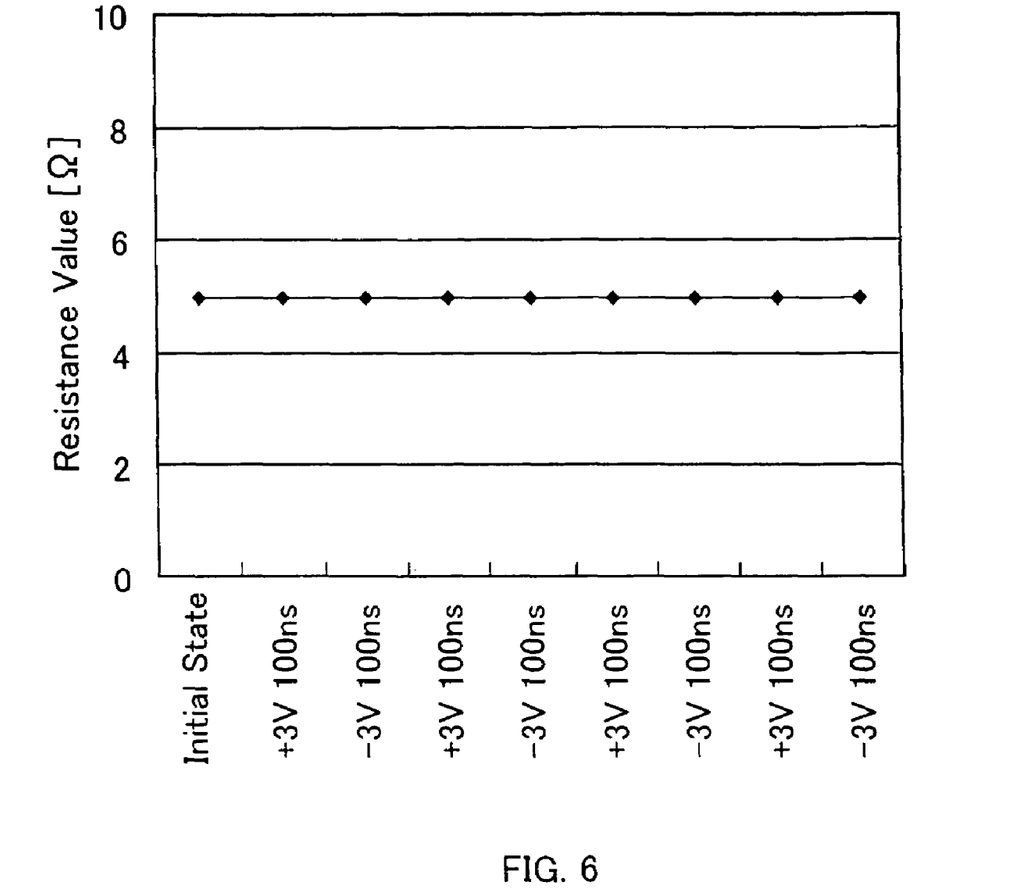
FIG. 6 is a graph showing a change in resistance value after voltage application in the case of the flat upper electrode.
Figure 7:
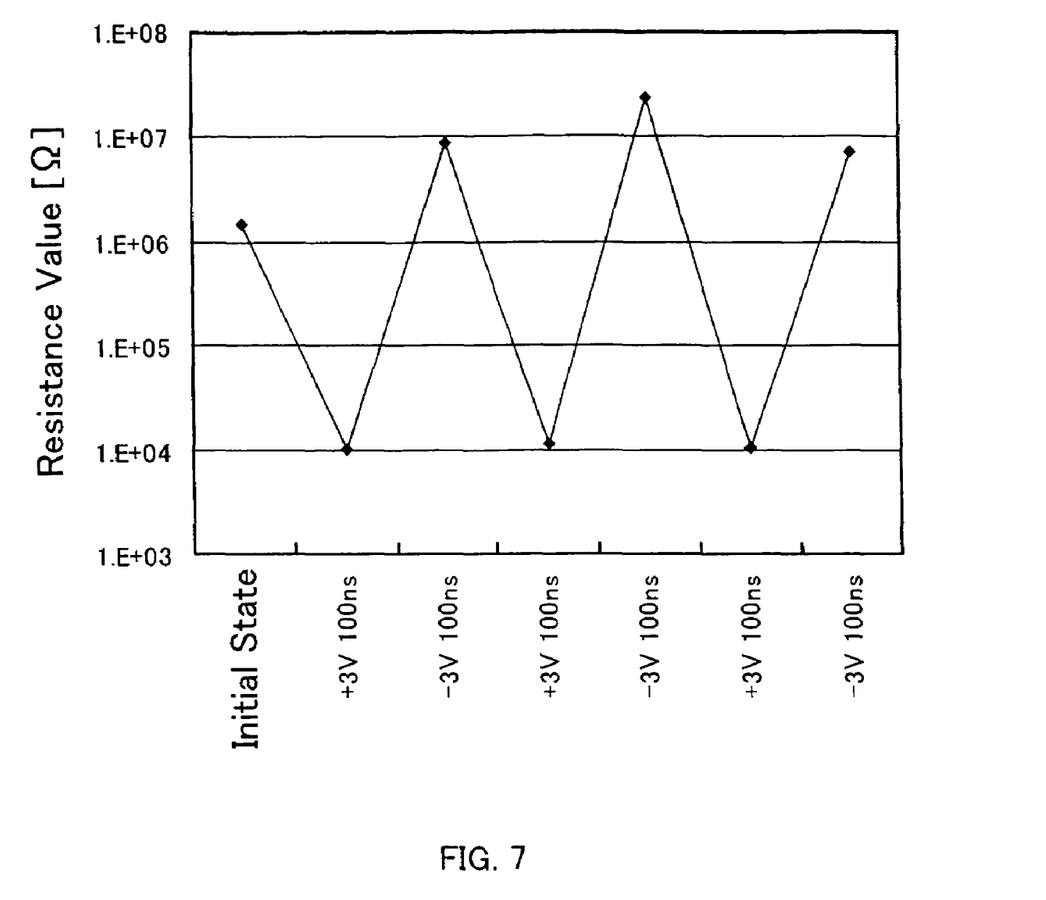
FIG. 7 is a graph showing a change in resistance value after voltage application in the case of the particulate upper electrode.

The initial resistance value was 10Ω or less when silver was used for the upper electrode 9 (flat electrode 9a), whereas the initial resistance value was about 1 MΩ when the silver paste was used for the upper electrode 9 (particulate electrode 9b). The use of the particulate electrode 9b enables the effective electrode contact area to decrease. The degree of this decrease in effective electrode contact area by the use of the particulate electrode 9b is considered to be larger than the foregoing estimation result. This is presumably caused by an error factor such as imperfect spherical forms of the silver particles, variations in diameters of the silver particles, or an excessively large clearance used in the estimation calculation. In any case, the use of the flat electrode 9a as the upper electrode 9 is practically not desirable because, with the resistance value of the variable resistor 8 being 10Ω or less, application of a voltage pulse for allowing the variable resistor 8 to change the resistance requires a pulse application circuit with a considerably low output impedance and, besides, a large current flows. When the variable resistor 8 is actually driven at a pulse of 3 V for 100 ns by a pulse power source with an output impedance of 50Ω, as shown in FIG. 6, the voltage is not sufficiently applied to the variable resistor 8, and hence no resistance change occurs. On the other hand, in the case of using the silver paste electrode (particulate electrode 9b), the effective electrode contact area decreases and the initial resistance value is about 1 MΩ, allowing easy driving of the variable resistor 8 by a pulse electric power with an output impedance of 50Ω. FIG. 7 shows the result of application of a pulse to change the resistance. It was confirmed that alternating application of a pulse of +3 V for 100 ns and a pulse of −3 V for 100 ns leads to a reversible change in resistance value of the variable resistor 8.

As described above, it was confirmed that the use of the particulate electrode as the upper electrode 9 can adjust the initial resistance value of the variable resistive element 10 to a high value. Further, the use of the particulate electrode brings about another advantage of obtaining a desired resistance value while the electrode area remains fixed, by adjustment of the particle diameter or density of the particulate conductors.

In the above embodiment, the PCMO film was used as the variable resistor 8 with the perovskite-type crystal structure.

Figure 8:
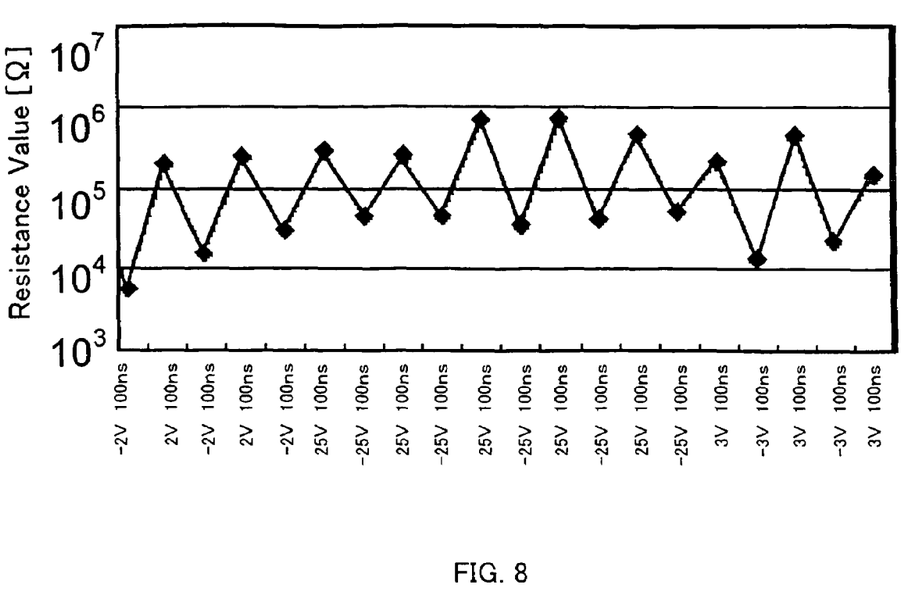
FIG. 8 is a graph showing a change in resistance value after voltage application in the case where the variable resistive element with a perovskite-type crystal structure is strontium titanate with lanthanum doped therein, and the upper electrode is a particulate electrode.

However, the variable resistor 8 with the perovskite-type crystal structure may be made of a perovskite-type crystal material other than the PCMO film. For example, a voltage pulse may be applied by using strontium titanate with lanthanum doped therein, to change the resistance. The results of this change in resistance are shown in FIG. 8. From this figure, the change in resistance value due to voltage application can be confirmed as in the case of the PCMO film.

In the above embodiment, the particulate electrode is used, which is formed of a silver paste obtained by dispersing silver particles as the particulate conductors in a resin, in order to reduce the effective electrode contact area between the upper electrode 9 and the variable resistor 8. However, particles of platinum, gold or other metals, other than the silver particles, may be used as the particulate conductors. Further, an insulative inorganic material may be used in place of the resin.

Further, the particulate electrode may be formed by a method of forming an insulating film on the variable resistor 8 to implant the particulate conductors (conductive particles) in the insulating film, in addition to the foregoing method of applying a paste obtained by dispersing the particulate conductors in the insulating material. For example, a silicon oxide film having a thickness of about 10 to 50 nm is formed on the variable resistor 8, and metal ions, such as silver, copper, gold or platinum ions, are implanted at a dose amount of $10^{16}$ to $10^{18}$ cm$^{-2}$ in the vicinity of the interface between the silicon oxide film and the variable resistor 8, with an implanting energy of 10 to 200 keV, to form a particulate electrode. The ions to be implanted are preferably minus ions so as to prevent electric breakdown of insulator due to charging up of a current in the insulating film. Further, thermal treatment at about 150 to 600° C. may be conducted after the ion implantation.

In the above embodiment, the element structure was described, in which only the upper electrode 9 was a particulate electrode. However, in place of or in addition to the upper electrode 9, the lower electrode 7 may be a particulate electrode.

The particulate conductors constituting the particulate electrode in the above embodiment may be in the form capable of reducing the electric contact area at the interface between the variable resistor and the particulate electrode, and is thus not necessarily limited to the form approximate to a sphere.

Next, an example will be described using drawings, in which the variable resistive element 10 produced in the forgoing manner is arranged in array form as a memory cell to form a memory array 101 for constituting a nonvolatile semiconductor memory device with a great capacity as the inventive device 100.

Figure 9:
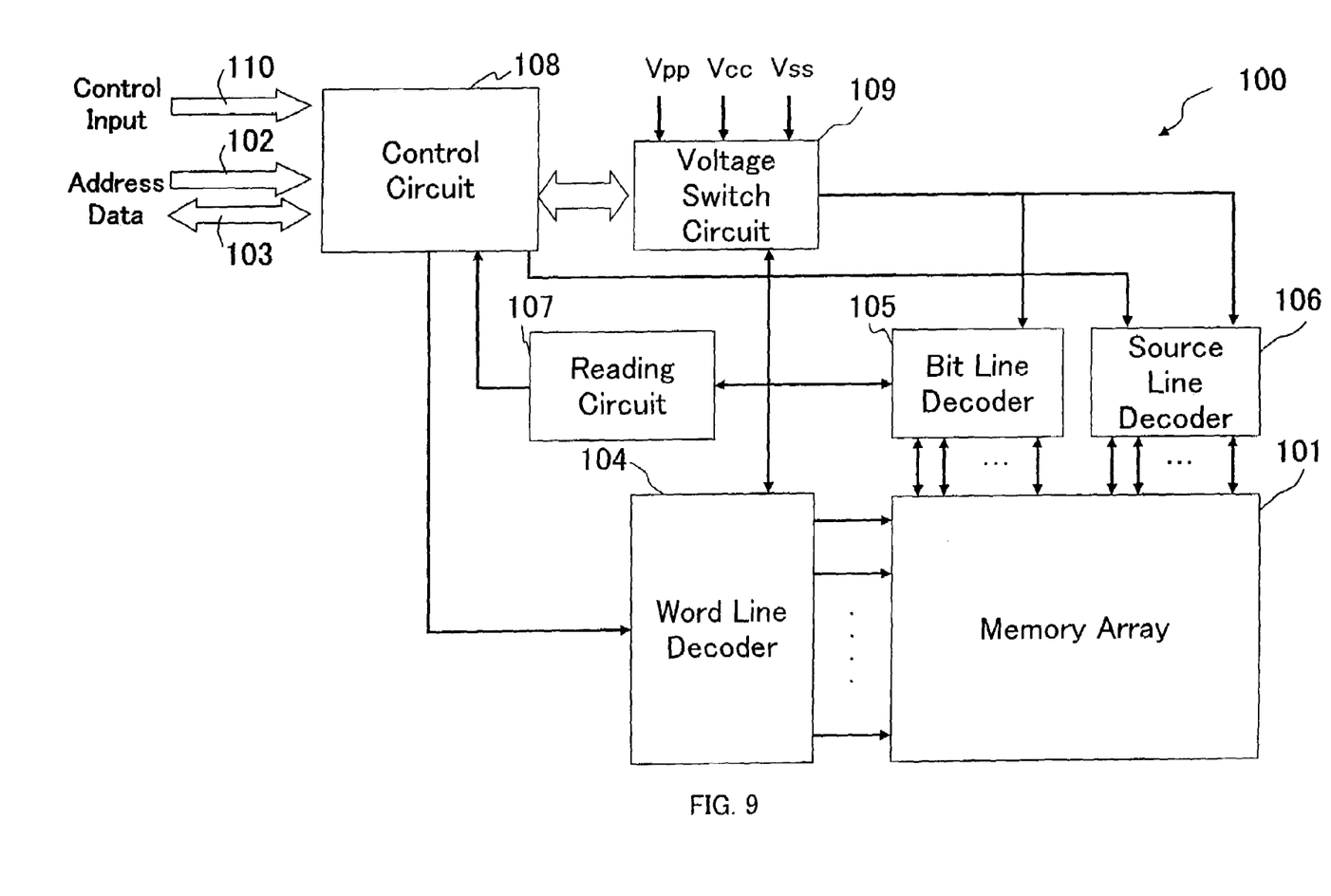
FIG. 9 is a block diagram showing the whole structure of a nonvolatile semiconductor memory device according to the present invention.

FIG. 9 shows a block diagram of the inventive device 100. In the inventive device 100, information is stored in a memory array 101. The memory array 101 has a structure where a plurality of memory cells are arranged as described above. The information is stored in the memory cells in the memory array 101 and is readable therefrom.

Figure 10:
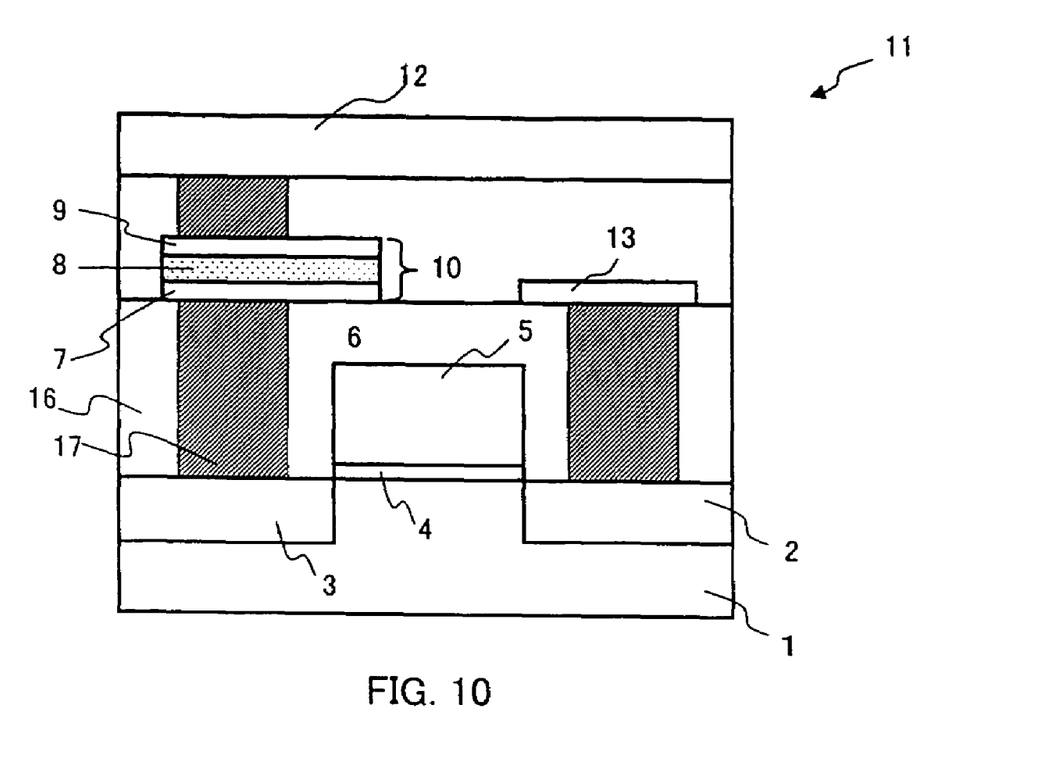
FIG. 10 is a cross-sectional view schematically showing a structure of a memory cell for use in the nonvolatile semiconductor memory device according to the present invention.

FIG. 10 is a cross sectional view schematically showing a memory cell 11 constituting the memory array 101. As shown in FIG. 10, the memory cell 11 is formed by a selection transistor 6 comprising of a source region 2 and a drain region 3 formed on a semiconductor substrate 1, and a gate electrode 5 formed on a gate oxide film 4. The variable resistive element 10 is formed by sandwiching, between the lower electrode 7 and the upper electrode 9, the variable resistor 8, the resistance value of which changes due to voltage application. The selection transistor 6 and the variable resistive element 10 are connected to each other in series by electric connection between the drain region 3 and the lower electrode 7. Further, the upper electrode 9 is connected to metal interconnects 12 to serve as bit lines. The gate electrode 5 is connected to word lines. The source region is connected to a diffusion layer or a metal interconnect 13 to serve as source lines. The variable resistive element 10 is formed in the same manner as the variable resistive element 10, shown in FIG. 1 as a single element. However, in the structure of the memory cell shown in FIG. 10, the lower electrode 7 is not formed on the semiconductor substrate 1, but on a contact plug 17 which communicates with an interlayer insulating film 16 and the drain region 3.

Figure 11:
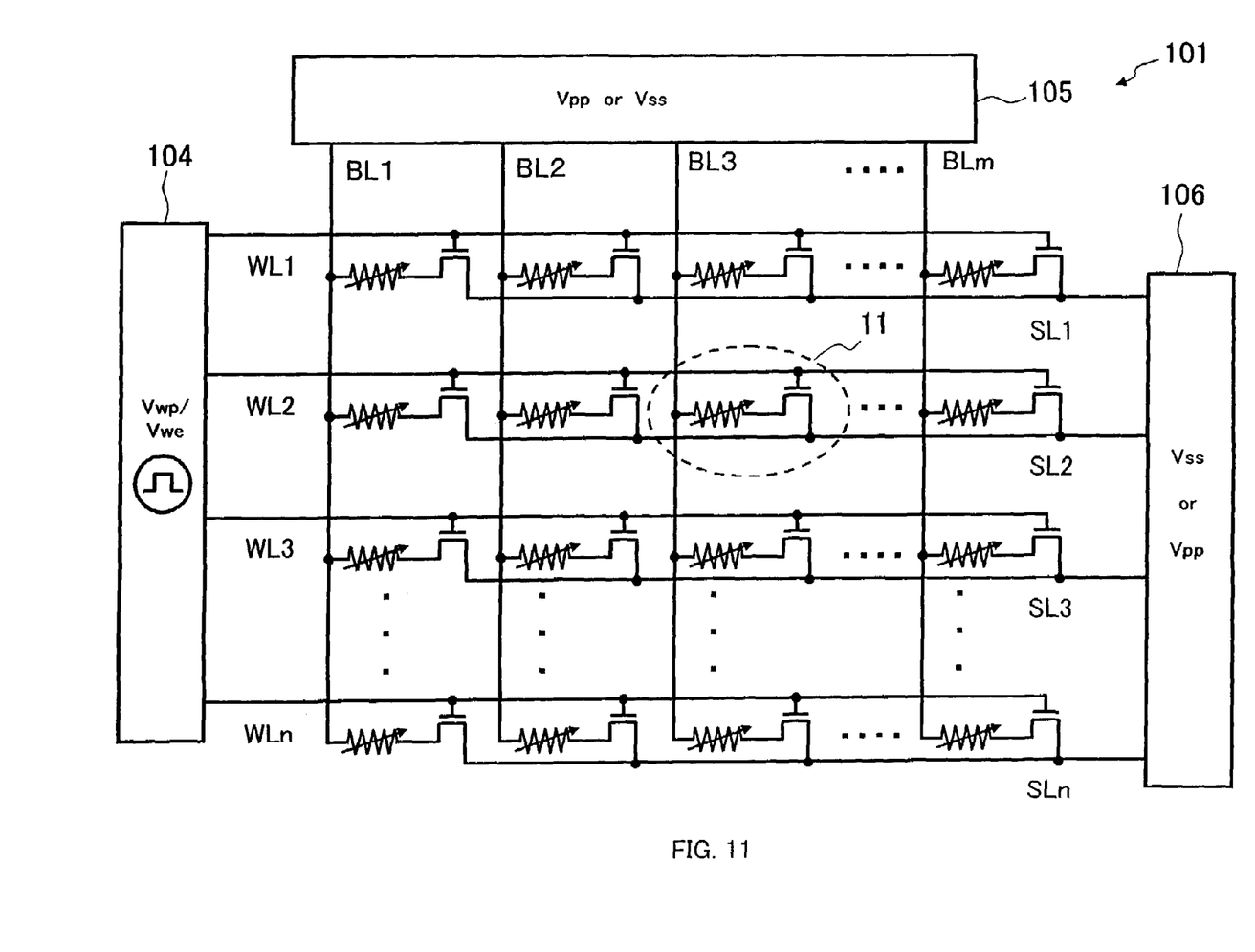
FIG. 11 is a circuit diagram schematically showing one configuration example of a memory array for use in the nonvolatile semiconductor memory device according to the present invention.

FIG. 11 is a view schematically showing one configuration example of the memory array 101. In this configuration of the memory array 101, at intersection points of "m" bit lines (BL1 to BLm) and "n" word lines (WL1 to WLn) ("m" and "n" are the numbers of the respective lines), "m×n" memory cells 11 are arranged. Further, "n" source lines (SL1 to SLn) are arranged to be parallel to the word lines. The configuration of the memory array 101 is not limited to that of FIG. 11.

As described above, with the memory cell 11 configured of the series circuit of the selection transistor 6 and the variable resistive element 10, the selection transistor 6 of the memory cell 11, selected based on the potential of the word lines, is turned on. Programming or erasing voltage is selectively applied exclusively on or to the variable resistive element 10 of the memory cell 11, selected based on the potential of the bit lines, and the resistance value of the variable resistor 8 of the variable resistive element 10 is changeable.

The block configuration including the peripheral circuit of the inventive device 100 shown in FIG. 9 is equivalent or similar to the block configuration of a typical nonvolatile semiconductor memory device. Each circuit block will be briefly described below. Information is stored in a specific memory cell in the memory array 101 corresponding to an address inputted from an address line 102. The information is then outputted to an external device through a data line 103. A word line decoder 104 selects a word line of the memory array 101 corresponding to a signal inputted to the address line 102. A bit line decoder 105 selects a bit line of the memory array 101 corresponding to an address signal inputted to the address line 102. Further, a source line decoder 106 selects a source line of the memory array 101 corresponding to an address signal inputted to the address line 102. A control circuit 108 controls programming, erasing and reading of the memory array 101. Based on an address signal inputted from the address line 102, data inputted from the data line 103 (in programming) and a control input signal inputted from a control signal line 110, the control circuit 108 controls reading, programming and erasing operations of the word line decoder 104, the bit line decoder 105, the source line decoder 106, the voltage switch circuit 109 and the memory array 101. In the example shown in FIG. 1, the control circuit 108 has functions as a typical address buffer circuit, data input/output buffer circuit, and control input buffer circuit, although those circuits are not shown in the figure.

The voltage switch circuit 109 provides voltages of the word lines, the bit lines and the source lines, which are required in reading, programming or erasing of the memory array 101. Vcc is a supplied voltage of the device, Vss is a ground voltage, and Vpp is a voltage for programming or erasing. Further, data is read from the memory array through the bit line decoder 105 and a reading circuit 107. The reading circuit 107 determines the state of the data, and sends the determination result to the control circuit 108 to be outputted to the data line 103.

The block configuration and the memory cell configuration of the inventive device 100 shown in FIG. 9 are one example, and are thus changeable according to the characteristics or the like of the variable resistive element 10. For example, the memory cell 11 may not be configured of the series circuit of the selection transistor 6 and the variable resistive element 10, but configured of the single variable resistive element 10. Alternatively, the selection transistor 6 may be replaced with a selection diode.

As specifically described above, in the nonvolatile semiconductor memory device according to the present invention, the use of the particulate electrode as an electrode constituting the variable resistive element enables the resistance value of the variable resistive element to be within an appropriate range even if the thickness of the variable resistor film with the perovskite-type crystal structure is reduced to lower the volume resistivity. As a result, a variable resistive element capable of operating at low voltage with low power electric consumption can be realized. Moreover, the thickness of the variable resistor film can be reduced to cut the film-forming time for the variable resistor, enabling improvement in productivity in the production process. Consequently, a nonvolatile semiconductor memory device capable of operating at low voltage with low power electric consumption can be provided at low production cost.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
   a variable resistive element formed by sequentially stacking a lower electrode, a variable resistor with a perovskite-type crystal structure, and an upper electrode, wherein
   at least one of the lower electrode and the upper electrode is configured to include a particulate conductor aggregate, and total area of electrical point contacts between the particulate electrode and the variable resistor is smaller than an area of a whole interface between them.

2. A nonvolatile semiconductor memory device comprising:
   a variable resistive element formed by sequentially stacking a lower electrode, a variable resistor with perovskite-type crystal structure, and an upper electrode, wherein
   at least one of the lower electrode and the upper electrode is configured to include a particulate conductor aggregate, and
   the particulate electrode is formed by dispersing the particulate conductors in an insulator.

3. The nonvolatile semiconductor memory device according to claim 1, wherein the variable resistor is formed at a temperature of 500° C. or above.

4. The nonvolatile semiconductor memory device according to claim 1, wherein the variable resistor is an epitaxial film or a partially epitaxial film.

5. The nonvolatile semiconductor memory device according to claim 1, wherein the variable resistor in a low resistance state has a volume resistivity of 100 Ωcm or less.

6. The nonvolatile semiconductor memory device according to claim 2, wherein a film of the variable resistor is formed at a film-forming temperature of 500° C. or above.

7. The nonvolatile semiconductor memory device according to claim 2, wherein the variable resistor is an epitaxial film or a partially epitaxial film.

8. The nonvolatile semiconductor memory device according to claim 2, wherein the variable resistor in a low resistance state has a volume resistivity of 100 Ωcm or less.

* * * * *